United States Patent
Kim et al.

(10) Patent No.: US 8,796,835 B2
(45) Date of Patent: Aug. 5, 2014

(54) PACKAGE ON PACKAGE HAVING IMPROVED THERMAL CHARACTERISTICS

(75) Inventors: Yoon-Hoon Kim, Suwon-si (KR); Joong-Hyun Baek, Suwon-si (KR); Eun-Seok Cho, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 246 days.

(21) Appl. No.: 13/153,953

(22) Filed: Jun. 6, 2011

(65) Prior Publication Data

US 2011/0304035 A1 Dec. 15, 2011

(30) Foreign Application Priority Data

Jun. 11, 2010 (KR) .................. 10-2010-0055467

(51) Int. Cl.
*H01L 23/02* (2006.01)

(52) U.S. Cl.
USPC .................................. 257/686; 257/E25.027

(58) Field of Classification Search
USPC .......................... 257/686, E25.027
See application file for complete search history.

(56) References Cited

U.S. PATENT DOCUMENTS

| 7,217,993 B2 * | 5/2007 | Nishimura ................ 257/686 |
| 7,829,992 B2 * | 11/2010 | Sugino et al. ............ 257/686 |
| 2008/0211078 A1 * | 9/2008 | Kwon et al. ............... 257/686 |

FOREIGN PATENT DOCUMENTS

| JP | 2006295136 A | 10/2006 |
| KR | 20070030034 A | 3/2007 |
| KR | 10-0885419 A | 10/2007 |

OTHER PUBLICATIONS

Abstract of KR 20070105553.

* cited by examiner

*Primary Examiner* — Stephen W Smoot
*Assistant Examiner* — Vicki B Booker
(74) *Attorney, Agent, or Firm* — Harness, Dickey & Pierce, P.L.C.

(57) ABSTRACT

Provided is a package on package (POP) having improved thermal and electric signal transmitting characteristics. The POP may include a first semiconductor package, a second semiconductor package larger than the first semiconductor package and mounted on the first semiconductor package, and a heat slug adhered to a bottom of a second substrate of the second semiconductor package and surrounding a side of the first semiconductor package. The heat slug may be a capacitor.

20 Claims, 5 Drawing Sheets

PACKAGE ON PACKAGE HAVING IMPROVED THERMAL CHARACTERISTICS

CROSS-REFERENCE TO RELATED APPLICATIONS

This application claims priority under 35 U.S.C. §119 to Korean Patent Application No. 10-2010-0055467, filed on Jun. 11, 2010, in the Korean Intellectual Property Office (KIPO), the disclosure of which is incorporated herein in its entirety by reference.

BACKGROUND

1. Field

Example embodiments of the inventive concepts relate to a package on package (POP), in which at least two semiconductor packages are stacked on each other, and more particularly, to a POP, in which a size of an upper semiconductor package is larger than a size of a lower semiconductor package.

2. Description of the Related Art

Semiconductor packages are becoming more integrated so as to expand capacities and functions of the semiconductor packages. In the conventional art, an integrated semiconductor package, wherein at least two semiconductor chips or semiconductor packages are integrated into one, is becoming more commonly used. If functions of a semiconductor devices are to be expanded via increasing integration of the semiconductor devices in a wafer state, high investment in equipments to manufacture a wafer as well as other high expenses are required, and errors may occur while expanding the functions via increasing integration.

However, the functions of the semiconductor devices may be expanded without the high investment, the high expenses, and the errors, by using a multi chip package (MCP) that integrates at least two semiconductor chips into one semiconductor package. In the conventional art, at least two semiconductor chips are assembled into the semiconductor package after the semiconductor chips are completely prepared. Similarly, the functions of the semiconductor devices may be expanded without the high investment, the high expenses, and the errors, by preparing a POP by integrating at least two semiconductor packages into one, after preparing the semiconductor packages in a wafer state.

Accordingly, expanding the functions of the semiconductor devices may be performed while assembling the semiconductor packages and thus, expanding the functions may be performed with lower investment in equipments and lower expenses than the expanding of the functions of the semiconductor device in the wafer state. Thus, semiconductor device manufacturers are developing integrated semiconductor packages, such as a system in package (SIP), an MCP, and a POP.

SUMMARY

Example embodiments of the inventive concepts provide a package on package (POP) having a semiconductor with improved thermal characteristics and electric noise characteristics by changing a design of an internal structure of the semiconductor package.

In accordance with example embodiments of the inventive concepts, a package on package (POP) having improved thermal characteristics may include a first semiconductor package, a second semiconductor package on the first semiconductor package, and at least one heat slug. The first semiconductor package may have at least one first semiconductor chip on a first substrate. The second semiconductor package may have at least one second semiconductor chip on a second substrate. The at least one heat slug may be on a bottom of the second substrate and the at least one heat slug may be arranged adjacent to at least two sides of the first semiconductor package.

In accordance with example embodiments of the inventive concepts, there is provided a package on package (POP) having improved thermal characteristics. In example embodiments, the POP may include a first semiconductor package, a second semiconductor package larger than the first semiconductor package and mounted on the first semiconductor package, and a heat slug adhered to a bottom of a second substrate of the second semiconductor package and surrounding a side of the first semiconductor package.

In example embodiments, a signal line of the second semiconductor package may be electrically connected to a signal line on a first substrate of the first semiconductor package. The heat slug may be adhered to the bottom of the second substrate of the second semiconductor package by using an anisotropic conductive film (ACF) or an anisotropic conductive paste (ACP). The heat slug may be connected to a power terminal or a ground terminal at the bottom of the second substrate of the second semiconductor package. A solder ball or an ACP may be further formed at a bottom of the heat slug. The heat slug may be formed along an edge of the second semiconductor package, and may include an opened region for air to flow through.

In example embodiments, the second semiconductor package may be a multi chip package (MCP), in which a plurality of semiconductor chips are vertically stacked on each other. In the MCP, the plurality of semiconductor chips may be connected to the second substrate of the second semiconductor package via one connecting unit selected from the group consisting of a wire, a through silicon via (TSV), and a bump.

In example embodiments, the heat slug may be formed of a metal having excellent heat transfer characteristics.

In accordance with example embodiments of the inventive concepts, there is provided a package on package (POP) having improved thermal characteristics. In example embodiments, the POP may include a first semiconductor package, a second semiconductor package larger than the first semiconductor package and mounted on the first semiconductor package, a first heat slug adhered along an outermost edge of a bottom of a second substrate of the second semiconductor package and surrounding a side of the first semiconductor package, and a second heat slug surrounded by the first heat slug at the bottom of the second substrate of the second semiconductor package and surrounding the side of the first semiconductor package.

The POP may further include a high-dielectric adhesive for adhering the first heat slug and the second heat slug together. The POP may further include a third heat slug surrounded by the second heat slug and surrounding the side of the first semiconductor package.

The third heat slug may be adhered to the second heat slug by using a high-dielectric adhesive.

In example embodiments, a signal line of the second semiconductor package may be electrically connected to a signal line of a first substrate of the first semiconductor package.

The first through third heat slugs may be connected to a power terminal or a ground terminal of the second substrate of the second semiconductor package. The first through third heat slugs may be formed along an edge of the second semiconductor package, and may include an opened region for air to flow. The first through third heat slugs may be formed of a metal having excellent heat transfer characteristics.

In example embodiments, the side of the first semiconductor package may not contact the third heat slug. The second semiconductor package may be a multi chip package (MCP), in which a plurality of semiconductor chips is vertically stacked on each other.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF EXAMPLE EMBODIMENTS

Figure 1:
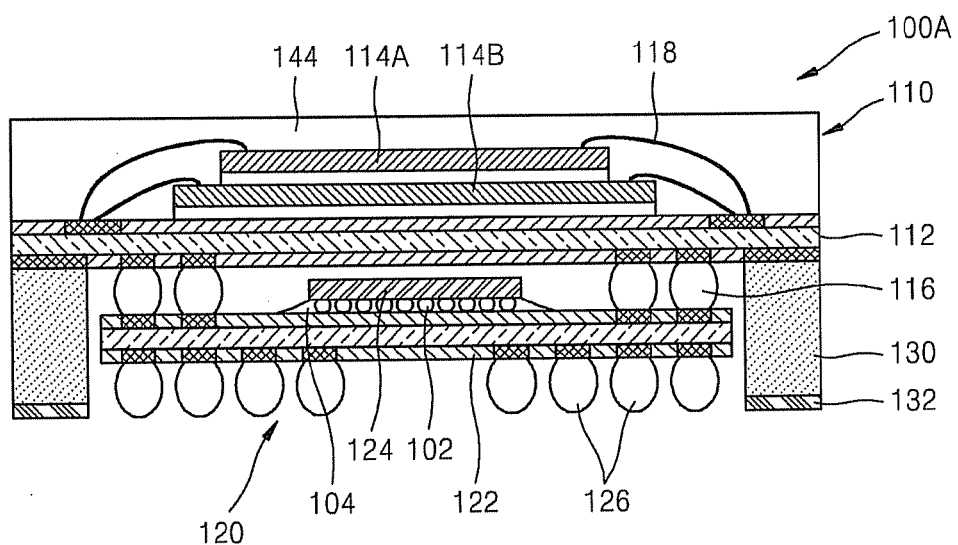
FIG. 1 is a cross-sectional view of a package on package (POP) having improved thermal characteristics, according to example embodiments of the inventive concepts.

Example embodiments will now be described more fully with reference to the accompanying drawings in which example embodiments are shown. The inventive concepts may, however, be embodied in different forms and should not be construed as limited to example embodiments set forth herein. Rather, example embodiments are provided so that this disclosure is thorough and complete and fully conveys the inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers that may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which the inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The attached drawings for illustrating example embodiments of the inventive concepts are referred to in order to gain a sufficient understanding of the example embodiments, the merits thereof, and the objectives accomplished by the implementation of the example embodiments.

Hereinafter, example embodiments will be described in detail with reference to the attached drawings. Like reference numerals in the drawings denote like elements.

FIG. 1 is a cross-sectional view of a package on package (POP) 100A having improved thermal characteristics, according to example embodiments of the inventive concepts.

Referring to FIG. 1, the POP 100A according to example embodiments includes a first semiconductor package 120, a second semiconductor package 110 mounted on the first semiconductor package 120, and a first heat slug 130 that is adhered to a bottom of a second substrate 112 of the second semiconductor package 110. In example embodiments, the second semiconductor package 110 is larger than the first semiconductor package 120 and the first heat slug 130 surrounds a side of the first semiconductor package 120.

As shown in FIG. 1, a semiconductor chip 124 may be mounted on a first substrate 122 of the first semiconductor package 120 via bumps 102, and solder balls 126 constituting external connecting terminals may be adhered to a bottom of the first substrate 122. A circuit region of the semiconductor chip 124 may be protected by forming an underfill 104 using epoxy or the like, between the semiconductor chip 124 and the first substrate 122.

In FIG. 1, the semiconductor chip 124 is mounted on the first substrate 122 via the bump 102, but alternatively, the semiconductor chip 124 may be mounted on the first substrate 122 via an adhesive tape and electrically connected to the first substrate 122 via a wire. In this case, the semiconductor chip 124 may be protected by an encapsulation resin, such as an epoxy mold compound (EMC), for sealing the entire semiconductor chip 124.

The semiconductor chip 124 may be a microcontroller or a microprocessor. If the first semiconductor package 120 is a semiconductor device that emits a large amount of heat, the first semiconductor package 120 may further include a heat radiator connected to the semiconductor chip 124 or the first substrate 122.

In example embodiments, a plurality of semiconductor chips 114A and 114B may be vertically stacked on the second substrate 112 of the second semiconductor package 110, and the plurality of semiconductor chips 114A and 114B may be electrically connected to the second substrate 112 via wires 118. The semiconductor chips 114A and 114B, the wires 118, and an upper portion of the second substrate 112 may be sealed by an encapsulation resin 144, for example, an EMC. A solder ball 116 constituting an external connecting terminal and corresponding to a signal line of the second semiconductor package 110 may be attached to the bottom of the second substrate 112, and may be electrically connected to a signal line of the first substrate 122 of the first semiconductor package 120 on the top of the first substrate 122.

In example embodiments, the semiconductor chips 114A and 114B may be memory devices, and may have the same size or different sizes. In FIG. 1, two semiconductor chips 114A and 114B are stacked on each other, but more than two semiconductor chips may be stacked on each other. In FIG. 1, the semiconductor chips 114A and 114B are electrically connected to the second substrate 112 via the wires 118, but example embodiments are not limited thereto. For example, the semiconductor chips 114A and 114B may also be electrically connected to the second substrate 112 via through silicon vias (TSVs) or a bump.

In example embodiments, the first heat slug 130 may be adhered to the bottom of the second substrate 112 of the second semiconductor package 110 by using an anisotropic conductive film (ACF) or an anisotropic conductive paste (ACP). The first heat slug 130 may be connected to a power terminal or a ground (Vss) terminal of the second substrate 112, and may be formed of a metal having excellent heat transfer characteristics, for example, copper or aluminium. If required, a surface of the first heat slug 130 may be coated with a metal having excellent oxidation resistance, for example, nickel or palladium.

When the first heat slug 130 is connected to the ground terminal of the second substrate 112, the second semiconductor package 110 may secure a large area for the ground terminal in the second semiconductor package 110. Accordingly, since a large electric charge storing space may be obtained, the first and second semiconductor packages 120 and 110 may be prevented from being damaged by electrostatic discharge (ESD). Or, in the alternative, the large electric storing space may at least reduce or minimize damage to the semiconductor packages 120 and 11 by ESD. Also, since the first heat slug 130 blocks an electrical field that is externally emitted, electromagnetic interference (EMI), which may generate errors in an electronic device using high frequency, may be prevented or reduced. Moreover, when the second semiconductor package 110 is operated at a high speed, the first heat slug 130 operates as a path for externally emitting heat generated inside the first and second semiconductor packages 120 and 110. Thus, the second semiconductor package 110 in the POP 100A may have remarkably improved thermal characteristics.

An ACF 132 may be further formed at a bottom of the first heat slug 130. Accordingly, when the POP 100A is mounted on a mother board, the POP 100A may be mounted with the solder ball 126 of the first semiconductor package 120. Consequently, a bottom level of the first heat slug 130 may be identical to a bottom level of the solder ball 126 of the first semiconductor package 120. Alternatively, the bottom level of the first heat slug 130 may be a little lower than the bottom level of the solder ball 126 considering that a height of the solder ball 126 decreases when mounted on the mother board.

Figure 2:
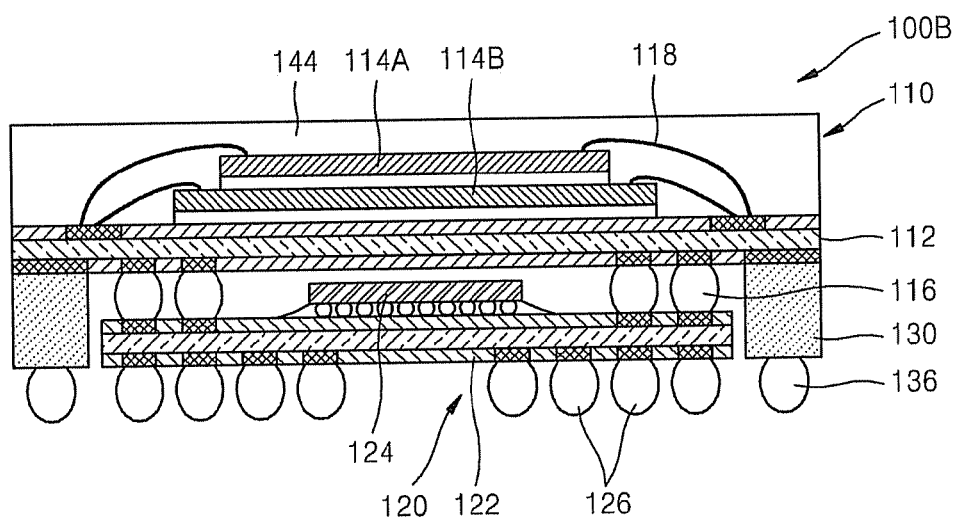
FIG. 2 is a cross-sectional view of a POP according to example embodiments of the inventive concepts, wherein a connecting unit at a bottom of a heat slug is different from that in FIG. 1.

FIG. 2 is a cross-sectional view of a POP 100B according to example embodiments of the inventive concepts, wherein a connecting unit at the bottom of the first heat slug 130 is different from that in FIG. 1. In detail, the ACF 132 is used as the connecting unit in the POP 100A of FIG. 1, but the POP 100B of FIG. 2 uses a solder ball 136, such as an ACP, instead of the ACF 132.

In example embodiments, some signal lines on a side of the first substrate 122 may be exposed on a surface of the first substrate 122. Also, since the first heat slug 130 is formed of a metal, the side of the first substrate 122 on which the signal lines are exposed and the first heat slug 130 may not physically contact each other because a short-circuit may form between the side of the first substrate 122 on which the signal lines are exposed and the first heat slug 130.

Figure 3:
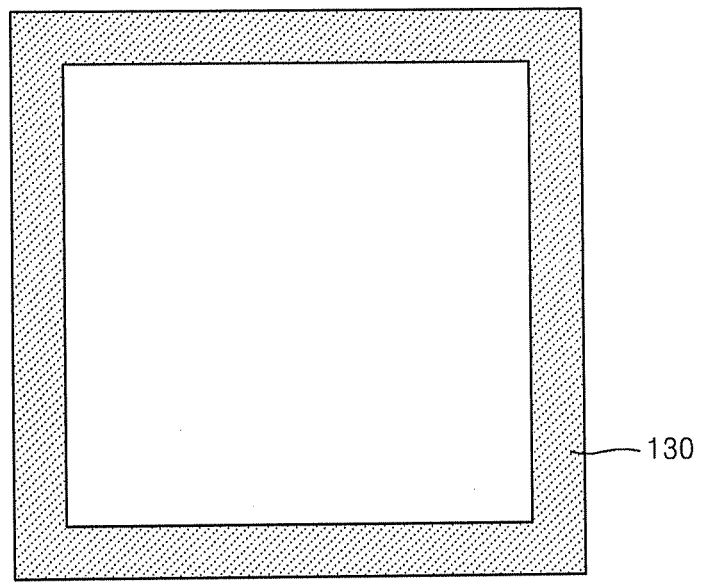
FIG. 3 is a plan view of a heat slug of the POP of FIG. 1 or 2, according to example embodiments of the inventive concepts.

FIG. 3 is a plan view of the first heat slug 130 of the POP 100A or 100B of FIG. 1 or 2, according to example embodiments of the inventive concepts.

Referring to FIG. 3, the first heat slug 130 of the POP 100A or 100B may have a rectangular structure formed along an edge of the second semiconductor package 110. Accordingly, when the first semiconductor package 120 is smaller than the second semiconductor package 110, a bottom space of the POP 100A or 100B may be used as a heat emitting path while preventing or reducing damage of the first and second semiconductor packages 120 and 110 due to ESD and blocking EMI. As shown in FIG. 3, the first heat slug 130 may be comprised of four conductive bars to form the rectangular structure. Although the first heat slug 130 is illustrated as having a rectangular shape, example embodiments are not limited thereto. For example, the first heat slug 130 could have a circular shape or an elliptical shape. Furthermore, the corners of the illustrated rectangular shape may be rounded.

The first heat slug 130 according to example embodiments may have a rectangular shape along the edge of the second semiconductor package 110. A relatively large solder ball may be directly attached to the first substrate 122 instead of attaching the first heat slug 130 to the second substrate 112 to be used as the heat emitting path, but in this case, it may be difficult to manufacture the relatively large solder ball to have a height corresponding to a height of the first semiconductor package 120. However, even if the relatively large solder ball is manufactured, a height of the relatively large solder ball decreases when the POP 100A or 100B is mounted on a mother board. Also, since an area of the relatively large solder ball is smaller than an area of the first heat slug 130, effects of heat emission, ESD damage prevention/reduction, and EMI blocking may be remarkably low.

Figure 4:
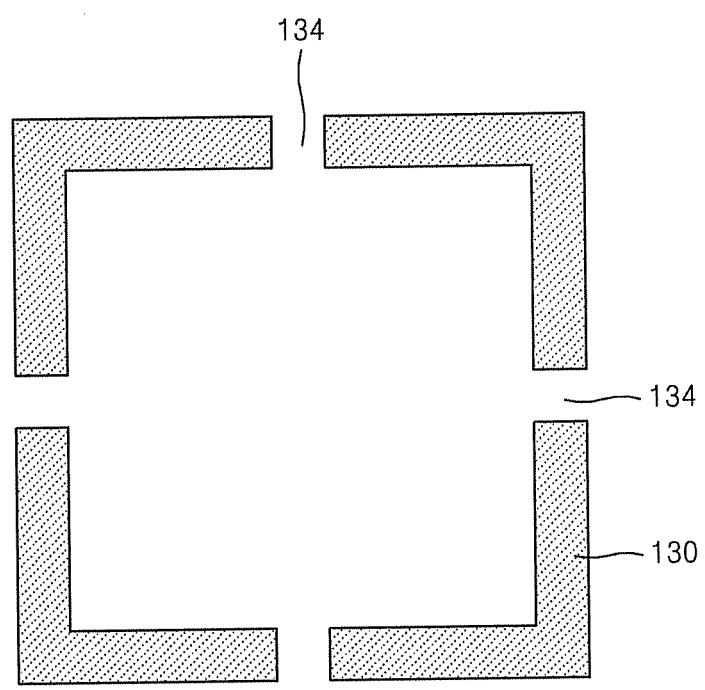
FIG. 4 is a plan view of the heat slug of the POP of FIG. 1 or 2, according to example embodiments of the inventive concepts.

FIG. 4 is a plan view of the first heat slug 130 of the POP 100A or 100B of FIG. 1 or 2, according to example embodiments of the inventive concepts.

Referring to FIG. 4, if the first heat slug 130 having the structure shown in FIG. 3 completely seals the side of the first semiconductor package 120, a heat emitting path of the first semiconductor package 120 may be blocked by the first heat slug 130. Accordingly, the first heat slug 130 according to example embodiments may include an opened region 134 for smoothly emitting heat generated in the first semiconductor package 120 outward. In FIG. 4, the opened region 134 may be formed on top, bottom, right, and left sides of the first heat slug 130, but example embodiments are not limited thereto and the opened region 134 may be formed in any of various manners according to a designer of the POP 100A or 100B.

Figure 5:
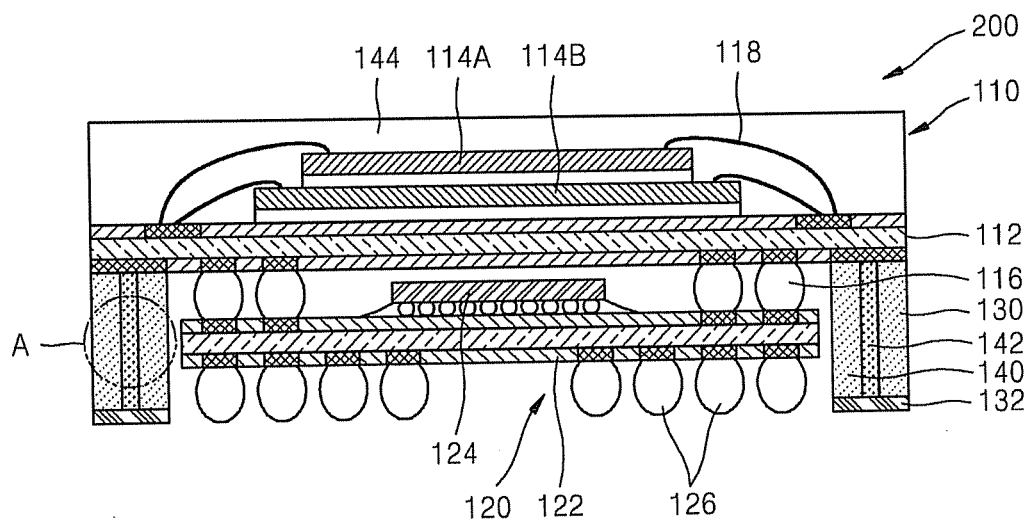
FIG. 5 is a cross-sectional view of a POP according to example embodiments of the inventive concepts, wherein an another heat slug is used in addition to the heat slug of FIG. 1.
Figure 6:
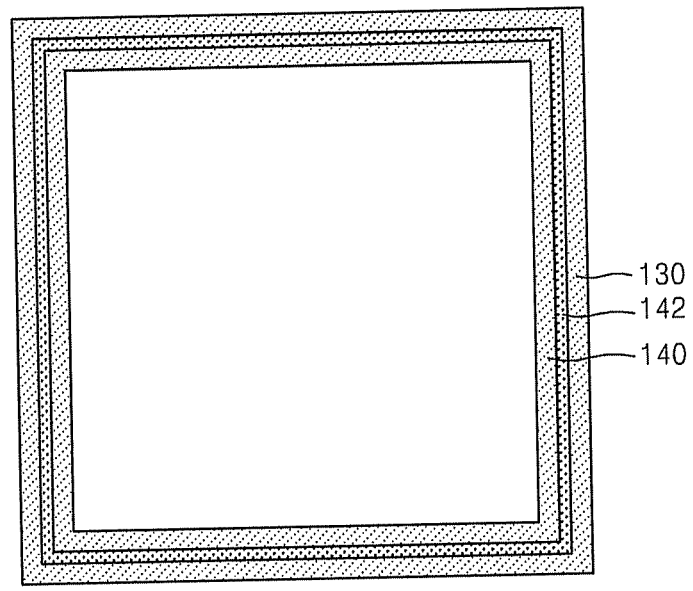
FIG. 6 is a plan view of the heat slugs of the POP of FIG. 5.

FIG. 5 is a cross-sectional view of a POP 200 according to example embodiments of the inventive concepts, wherein another heat slug, that is, a heat slug 140, is used in addition to the heat slug 130 of FIG. 1, and FIG. 6 is a plan view of the first heat slug 130 and the second heat slug 140 of the POP 200 of FIG. 5.

In example embodiments, only one first heat slug 130 may be used as illustrated in FIGS. 1 and 2. However, example embodiments are not limited thereto. For example, as shown in FIGS. 5 and 6, two heat slugs, the first heat slug 130 and the second heat slug 140, may be used in the POP 200. The POP 200 may further include the first and second semiconductor packages 120 and 110 already described above with respect to FIGS. 1 and 2, and thus descriptions thereof will not be repeated. Also, the first and second heat slugs 130 and 140 may also be adhered to the bottom of the second substrate 112 by using an ACF or an ACP, and the ACF 132 or the solder ball 136 may be formed at the bottom of the first heat slug 130 and at a bottom of the second heat slug 140.

As can be seen from a portion A in FIG. 5, in the POP 200 according to example embodiments, the first heat slug 130 may be adhered to the second heat slug 140 via a high-dielectric adhesive 142. In example embodiments one of the first and second heat slugs 130 and 140 may be attached to a power terminal of the second substrate 112 and the other of the first and second slugs 130 and 140 may be attached to a ground terminal of the second substrate 112. Accordingly, when the first heat slug 130 is connected to the power terminal of the second substrate 112 and the second heat slug 140 is connected to the ground terminal of the second substrate 112, the first and second heat slugs 130 and 140 including the high-dielectric adhesive 142 may function as a capacitor. Since the first and second heat slugs 130 and 140 connected to the second semiconductor package 110 function as a capacitor, the POP 200 may have decreased impedance and may decrease noise generated when transmitting a signal. Also, high frequency characteristics of the POP 200 may be improved.

In example embodiments, the first and second heat slugs 130 and 140 may seal the entire first semiconductor package 120 in FIG. 6, but may additionally have the opened region 134 as shown in FIG. 4.

Figure 7:
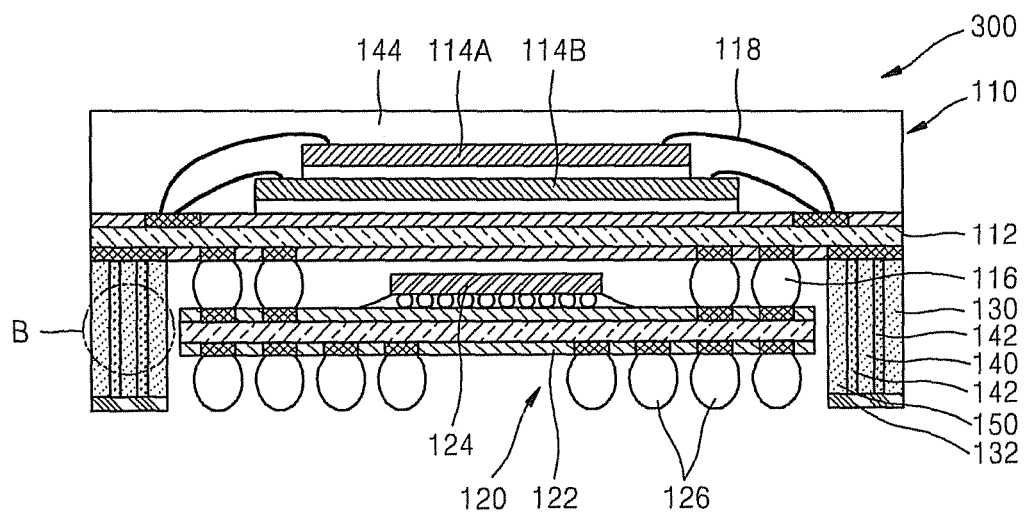
FIG. 7 is a cross-sectional view of a POP according to example embodiments of the inventive concepts, wherein two other heat slugs are used in addition to the heat slug of FIG. 1.
Figure 8:
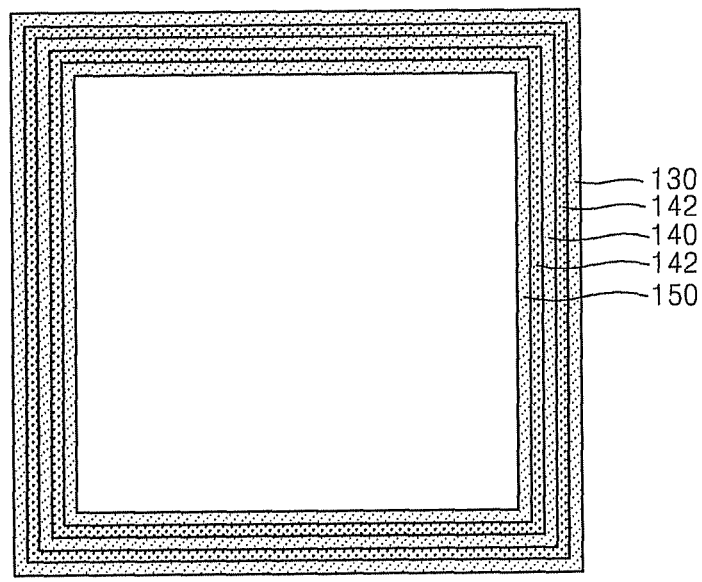
FIG. 8 is a plan view of the heat slugs of the POP of FIG. 7.

FIG. 7 is a cross-sectional view of a POP 300 according to example embodiments of the inventive concepts, wherein two other heat slug, that is, the heat slug 140 and a heat slug 150, are used in addition to the heat slug 130 in FIG. 1, and FIG. 8 is a plan view of the first through third heat slugs 130, 140, and 150 of the POP 300 of FIG. 7.

Referring to FIGS. 7 and 8, the first and second heat slugs 130 and 140 of FIGS. 5 and 6 function as one capacitor, whereas the first through third heat slugs 130 through 150 may function as two capacitors by adhering interfaces of the first through third heat slugs 130 through 150 with the high-dielectric adhesive 142 as shown in a portion B of FIG. 7. In example embodiments, the capacitor characteristics of the POP 300 may be at least twice those of the POP 200 of FIG. 5. Accordingly, the POP 300 may have improved high frequency characteristics and may be used to remove signal noise. In example embodiments, the first through third heat slugs 130 through 150 may be connected to the power terminal or the ground terminal of the second substrate 112, and may additionally include the opened region 134 of FIG. 4.

Figure 9:
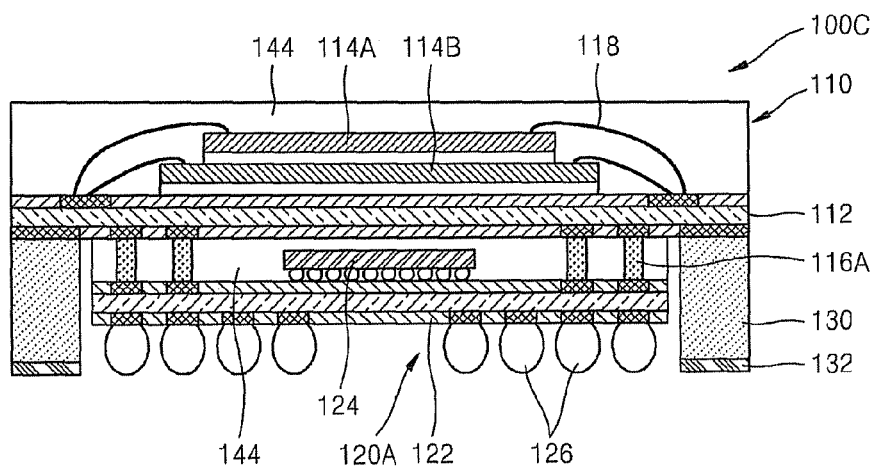
FIG. 9 is a cross-sectional view of a POP according to example embodiments of the inventive concepts, wherein signal lines of first and second semiconductor packages are different from those in FIG. 1.

FIG. 9 is a cross-sectional view of a POP 100C according to example embodiments of the inventive concepts, wherein signal lines of a first semiconductor package 120A and the second semiconductor package 110 are different from those in FIG. 1.

Compared to FIG. 9, the first semiconductor package 120 of FIG. 1 does not include an encapsulation resin. However, The POP 100C according to example embodiments has a laser drilled package (LDP) structure, wherein the first semiconductor package 120A includes the encapsulation resin 144. Accordingly, a signal may be transmitted between the first and second semiconductor packages 120A and 110 by using a through mold via (TMV) 116A, instead of the solder ball 116 of FIG. 1. In example embodiments, the TMV 116A may be formed by forming a via hole in the encapsulation resin 144 by using a laser drill, and filling the via hole with a conductive material. However, shapes and structures of the first and second semiconductor packages 120A and 110 are not limited thereto and may vary.

Figure 10:
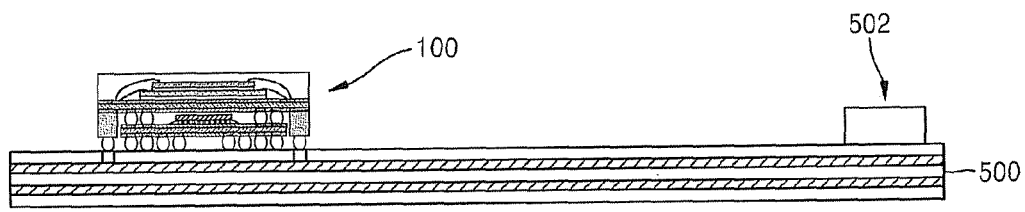
FIG. 10 is a cross-sectional view of the POP of FIG. 1 mounted on a mother board, according to example embodiments of the inventive concepts.

FIG. 10 is a cross-sectional view of a POP 100 mounted on a mother board 500, according to example embodiments of the inventive concepts.

Referring to FIG. 10, an electronic component 502 may be mounted on the mother board 500 used in an electronic device, and the POP 100 according to example embodiments may be mounted on the mother board 500. The POP 100 is mounted on the mother board 500 by using a solder board, but may also be mounted on the mother board 500 by using the ACF 132 of FIG. 1. Example embodiments are not limited to using the POP 100 as any one of the POPs 100A through 100C, 200, and 300 may be used.

The POPs according to example embodiments of the inventive concepts may be used in a system in package (SIP), and may be effective in increasing heat emission and reducing noise. Moreover, the POPs may be used when a second semiconductor package is to be larger than a first semiconductor package.

While the inventive concepts has been particularly shown and described with reference to example embodiments thereof, it will be understood that various changes in form and details may be made therein without departing from the spirit and scope of the following claims.

What is claimed is:

1. A package on package (POP) having improved thermal characteristics, the POP comprising:
   a first semiconductor package including a first substrate;
   a second semiconductor package on the first semiconductor package, the second semiconductor package including a second substrate and being larger than the first semiconductor package; and
   a first heat slug formed on an outermost edge region on a bottom of the second substrate, the first heat slug surrounding and being adjacent to outermost sides of the first substrate.

2. The POP of claim 1, wherein a signal line of the second semiconductor package is electrically connected to a signal line on a first substrate of the first semiconductor package.

3. The POP of claim 1, wherein the first heat slug is adhered to the bottom of the second substrate by one of an anisotropic conductive film (ACF) and an anisotropic conductive paste (ACP).

4. The POP of claim 1, wherein the first heat slug is connected to one of a power terminal and a ground terminal at the bottom of the second substrate.

5. The POP of claim 1, wherein one of a solder ball and an ACF is at a bottom of the first heat slug.

6. The POP of claim 1, wherein the first heat slug is along an edge of the second semiconductor package, and the first heat slug includes an opened region for air to flow through.

7. The POP of claim 1, wherein the first heat slug includes metal.

8. The POP of claim 1 further comprising:
   a second heat slug at the bottom of the second substrate, wherein
     the second heat slug surrounds the side of the first semiconductor package,
     the first heat slug is arranged along an outermost edge of the bottom of the second substrate, and
     the first heat slug surrounds the second heat slug.

9. The POP of claim 8, further comprising:
   a high-dielectric adhesive adhering the first heat slug to the second heat slug.

10. The POP of claim 8, further comprising:
    a third heat slug surrounded by the second heat slug, the third heat slug surrounding the side of the first semiconductor package.

11. The POP of claim 10, wherein the third heat slug is adhered to the second heat slug by a high-dielectric adhesive.

12. A package on package (POP) having improved thermal characteristics, the POP comprising:
    a first semiconductor package having at least one first semiconductor chip on a first substrate;
    a second semiconductor package on the first semiconductor package, the second semiconductor package having at least one second semiconductor chip on a second substrate; and
    at least one heat slug on a bottom of the second substrate, the at least one heat slug arranged to face at least two sides of the first semiconductor package,
    wherein the first substrate has a substantially smaller horizontal dimension than the second substrate.

13. The POP of claim 12, wherein the at least one heat slug is a plurality of heat slugs separated by at least one dielectric material.

14. The POP of claim 13, wherein at least one of the heat slugs is connected to a power terminal and another of the heat slugs is connected to a ground terminal.

15. The POP of claim 12, wherein the at least one heat slug defines an opened region between neighboring heat slugs for air to flow through.

16. The POP of claim 12, wherein the at least one heat slug includes at least four conductive bars arranged in a rectangular shape on a same layer.

17. The POP of claim 16, wherein the at least four conductive bars include an opened region for air to flow through.

18. The POP of claim 12, wherein the at least two sides of the first semiconductor package do not contact the at least one heat slug.

19. The POP of claim 12, wherein the at least one heat slug is arranged along an outermost edge of a bottom of the second substrate.

20. The POP of claim 12, wherein the at least one heat slug is a plurality of heat slugs separated by a plurality of dielectric layers.

* * * * *

UNITED STATES PATENT AND TRADEMARK OFFICE
CERTIFICATE OF CORRECTION

PATENT NO. : 8,796,835 B2  
APPLICATION NO. : 13/153953  
DATED : August 5, 2014  
INVENTOR(S) : Kim et al.

Page 1 of 1

It is certified that error appears in the above-identified patent and that said Letters Patent is hereby corrected as shown below:

On the title page, item (75) Inventors: should read,

Yong-hoon Kim, Suwon-si (KR);  
Joong-hyun Baek, Suwon-si (KR);  
Eun-seok Cho, Suwon-si (KR)

Signed and Sealed this  
Eleventh Day of November, 2014

Michelle K. Lee  
*Deputy Director of the United States Patent and Trademark Office*